United States Patent
Kripesh et al.

(10) Patent No.: US 7,189,594 B2
(45) Date of Patent: Mar. 13, 2007

(54) WAFER LEVEL PACKAGES AND METHODS OF FABRICATION

(75) Inventors: Vaidyanathan Kripesh, Singapore (SG); Wai Kwan Wong, Singapore (SG); Mihai Dragos Rotaru, Singapore (SG); Tai Chong Chai, Singapore (SG); Mahadevan Krishna Iyer, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 85 days.

(21) Appl. No.: 10/938,239

(22) Filed: Sep. 10, 2004

(65) Prior Publication Data

US 2006/0057832 A1    Mar. 16, 2006

(51) Int. Cl.
  H01L 21/50   (2006.01)
  H01L 21/48   (2006.01)
  H01L 21/44   (2006.01)
  H01L 23/48   (2006.01)
  H01L 23/52   (2006.01)

(52) U.S. Cl. .................. 438/107; 438/106; 257/691; 257/690

(58) Field of Classification Search ........ 438/106–107; 257/690–691
See application file for complete search history.

(56) References Cited

U.S. PATENT DOCUMENTS 6,437,426 B1 *  8/2002  Yoshida ............. 257/664
6,462,423 B1 * 10/2002  Akram et al. ......... 257/778
6,539,624 B1    4/2003  Kung et al.
6,596,560 B1    7/2003  Hsu
6,605,525 B2    8/2003  Lu et al.
6,608,389 B1 *  8/2003  Hashimoto .......... 257/784
2002/0100960 A1 *  8/2002  Chang et al. ........ 257/621
2003/0122229 A1    7/2003  Bakir et al.
2003/0124768 A1    7/2003  Hsu
2005/0087859 A1 *  4/2005  Chao et al. .......... 257/700

OTHER PUBLICATIONS

Fujitsu Microelectronics America, Inc., "Super CSP," pp. 17-19.
Elenius, Peter and Yang, Hong, "The Ultra CSP Wafer Scale Package," High Density Interconnect Conference And Expo, Tempe, Arizona, Sep. 15-16, 1998.

* cited by examiner

Primary Examiner—Luan Thai
(74) Attorney, Agent, or Firm—Conley Rose, P.C.

(57) ABSTRACT

A wafer level package formed on an integrated circuit chip having bondpads and a fabrication method therefor is disclosed. The wafer level package comprises at least one first, second and third separation layer having at least one first and second conductive layer formed in-between the separation layers. The at least one first conductive layer is formed on the at least one first separation layer and is coupled to the bondpads. The at least one second conductive layer is formed on the at last one second separation layer wherein the at least one second conductive layer is electrically coupled to the at least one first conductive layer. The at least one third separation layer allows solder to be attached to the at least one second conductive layer for electrically coupling the solder to the bondpads. A chip ground plane is laid in the integrated circuit chip for providing a ground to the at least one first conductive layer and the solder.

25 Claims, 4 Drawing Sheets

WAFER LEVEL PACKAGES AND METHODS OF FABRICATION

FIELD OF INVENTION

The invention relates generally to wafer level packaging. In particular, the invention relates to a wafer level package having a plurality of redistribution layers for redistributing peripheral bondpads of integrated circuit chips.

BACKGROUND

As integrated circuits become increasingly smaller and yield better operating performance, packaging technology for integrated circuit (IC) packaging has correspondingly evolved from leaded packaging to laminated-based ball grid array (BGA) packaging and eventually to chip scale packaging.

Any advancement in IC chip packaging technology is driven by ever-increasing needs for achieving better performance, greater miniaturization and higher reliability. New packaging technology has to further provide for the possibilities of batch production for the purpose of large-scale manufacturing thereby allowing economy of scale.

One specific form of chip scale package (CSP) is wafer level package (WLP). WLP adopts an area-array packaging approach that is utilised in BGA packaging. This approach enables WLP to have a packaging outline that is substantially identical in size to the IC chip, making WLP the smallest form of CSP. WLP allows the IC packaging process to be carried out at wafer level as well as incorporate wafer level reliability and facilitate IC burn-in test.

Efforts have been expended by many to propose a low-cost IC packaging solution in order to meet the ever-increasing demand for better wafer-level performance.

Wafer level packaging has therefore attracted immense interest in the electronics industry for being a potential solution in IC packaging process that can provide low-cost production through large-scale manufacturing.

U.S. Pat. No. 6,605,525 to Lu et al. proposes a thick stress buffer layer to be used between chip pad metallisation and redistribution layer. Solder bumping is carried out over the thick stress buffer layer to achieve WLP.

In "The Ultra CSP (tm) Wafer Scale Package", High Density Interconnect Conference and Expo, Tempe, AZ, Sep. 15–16, 1998 published by Peter Elenius and Hong Yang, a fabrication method for forming WLP by using solder bumps is disclosed. The solder bumps are supported by polymer collars and are soldered on a polymer substrate.

In a commercial literature titled "Super CSP" published by Fujitsu Microelectronics America, Inc, copper posts are shown to be used as a form of interconnection for connecting the solder bumps to the redistribution layer.

U.S. patent application Ser. No. 2003/0122229-A1 by Bakir et al. proposes a fabrication method for fabricating ultra fine-pitch WLP through the use of specialized proprietary materials to achieve fine-pitch compliant interconnects.

While the foregoing prior art disclose various methods for fabricating WLP, these methods have inherent limitations in relation to the use of common fabrication materials to achieve high frequency performance. Undesirable parasitic capacitance and inductance are typically present in WLP fabricated by conventional methods that use common fabrication materials. This renders unsuitable the use of these methods for fabricating WLP used in high frequency domains of RF and microwave applications. In prior art proposing the use of specialised proprietary materials, this results in the lowering of cost efficiency of fabricating WLP.

Accordingly there is a need for a method for WLP fabrication for achieving high frequency performance using common IC fabrication process and materials for large-scale industrial applications.

SUMMARY

Embodiments of the invention disclosed herein provide improved performance relating to high frequency response based on common fabrication process and materials. Additionally, the embodiments are suitable for industrial application that requires large-scale production.

A method for fabricating wafer level package having a plurality of separation and conductive layers formed on a surface of an integrated circuit chip is disclosed. The method comprising the steps of: forming at least one first separation layer on the surface of the integrated circuit chip having a bondpad thereon, wherein a portion of the bondpad is exposed; forming at least one first conductive layer on the at least one first separation layer, wherein the at least one first conductive layer is electrically coupled to the bondpad and extends substantially laterally away therefrom in a predetermined direction for a first predetermined length; forming at least one second separation layer on the first conductive layer wherein a portion of the at least one first conductive layer extending substantially laterally away from the bondpad in the predetermined direction for a first predetermined distance is exposed; forming at least one second conductive layer on the at least one second separation layer wherein the at least one second conductive layer is electrically coupled to the exposed portion of the at least one first conductive layer and extends substantially laterally away from the bondpad in the predetermined direction; and forming at least one third separation layer on the at least one second conductive layer wherein a portion of the at least one second conductive layer extending substantially laterally away from the bondpad in the predetermined direction is exposed wherein solder is electrically couplable to the exposed portion of the at least one second conductive layer whereby the solder is electrically communicable with the bondpad and the exposed portion of the at least one first conductive layer is substantially adjacent to the extremity of the at least one first conductive layer distal to the bondpad, and a chip ground plane is laid in the integrated circuit chip for providing a ground to the at least one first conductive layer and the solder.

The present invention further discloses a wafer level package having a plurality of separation and conductive layers formed on a surface of an integrated circuit chip. The wafer level package comprises at least one first separation layer formed on the surface of the integrated circuit chip having a bondpad thereon, wherein a portion of the bondpad is exposed. At least one first conductive layer is formed on the at least one first separation layer wherein the at least one first conductive layer is electrically coupled to the bondpad and extends substantially laterally away therefrom in a predetermined direction for a first predetermined length. At least one second separation layer formed on the at least one first conductive layer wherein a portion of the at least one first conductive layer extending substantially laterally away from the bondpad in the predetermined direction for a first predetermined distance is exposed. At least one second conductive layer formed on the at least one second separation layer wherein the second conductive layer is electrically coupled to the exposed portion of the first conductive layer and extends substantially laterally away from the bondpad in the predetermined direction, and at least one third separation layer formed on the at least one second conductive layer wherein a portion of the at least one second conductive layer extending substantially laterally away from the bondpad in the predetermined direction is exposed wherein solder is electrically couplable to the exposed portion of the at least one second conductive layer whereby the solder is electrically communicable to the bondpad and the exposed portion of the at least one first conductive layer is substantially adjacent to the extremity of the at least one first conductive layer distal to the bondpad, and a chip ground plane is laid in the integrated circuit chip for providing a ground to the at least one first conductive layer and the solder.

BRIEF DESCRIPTION OF THE DRAWINGS

Embodiments of the invention are described hereinafter with reference to the drawings, in which.

DETAILED DESCRIPTION

Figure 1A:
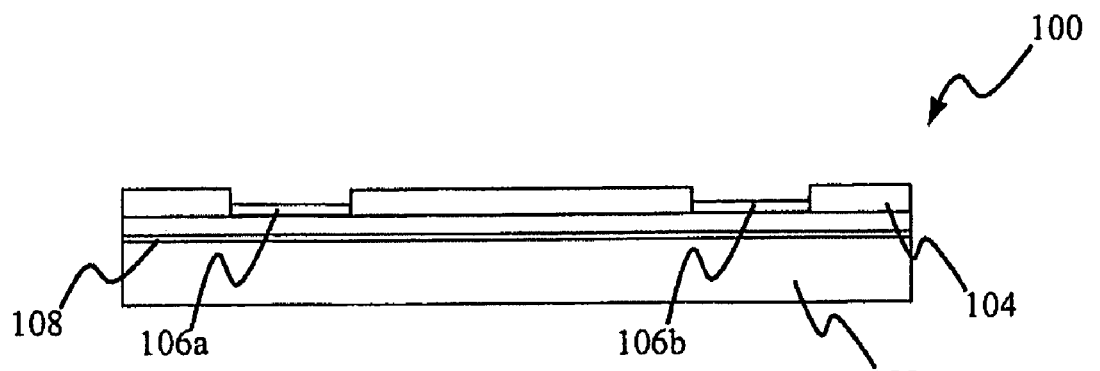
FIGS. 1A to 1G are cross-sectional views that illustrate processing steps for fabricating a wafer level package according to a first embodiment of the invention.

With reference to the drawings, a wafer level package according to embodiments of the invention having a plurality of separation and conductive layers is disclosed for improving performance related to high frequency response while achieving performance based on a combination of common integrated circuit (IC) fabrication process and materials. Additionally, the embodiments are suitable for industrial application that requires batch processing.

Various fabrication methods for wafer level package using common fabrication materials have been previously proposed. These conventional methods for fabricating wafer level package are not suitable for usage in high frequency domains of RF and microwave applications. Other conventional methods for wafer level package fabrication use specialised proprietary materials, resulting elevated cost of fabrication.

For purposes of brevity and clarity, the description of the invention is limited hereinafter to radio frequency (RF) and microwave applications. This however does not preclude embodiments of the invention from other applications that require similar operating performance as the RF and microwave applications. The functional principles fundamental to the embodiments of the invention remain the same throughout the variations.

In the detailed description provided hereinafter and FIGS. 1A to 1G and FIG. 2 of the drawings, like elements are identified with like reference numerals.

A preferred embodiment of the invention is described in greater detail hereinafter for a wafer level package 100.

With reference to FIG. 1A, a pre-processed semiconductor wafer containing multiple dies for fabricating the wafer level package 100 is shown. The semiconductor wafer can have diameters of various dimensions, such as 50 mm, 100 mm, 150 mm and 300 mm. Each die is an IC chip incorporated with microelectronics elements The wafer level package 100 preferably comprises a three-layer structure fabricated on a semiconductor substrate 102 that is made of a number of different materials including silicon (Si), silicon germanium (SiGe), gallium arsenide (GaAs), gallium nitride (GaN) and indium phosphide (InP). These materials are typically used for IC fabrication.

The top surface of each IC chip is typically passivated with a protective film 104. An exemplary material of the protective film 104 is a passivation layer that comprises silicon nitride ($Si_3N_4$). The protective film 104 contains a plurality of openings for exposing bondpads 106a and 106b. The plurality of openings preferably has a diameter of approximately 70 μm. The bondpads 106a and 106b, typically fabricated with aluminum (Al), are used for electrically connecting each die to an external circuitry. Thickness of the protective film 104 and the bondpads 106a and 106b varies with the type of IC chip used.

A chip ground plane 108 is typically laid in the substrate to provide grounding for the microelectronic elements in the IC chip.

For purposes of brevity and of clarity, the exposed surfaces of the bondpads 106a and 106b and the protective film 104 are hereinafter singularly known as the surface of the IC chip.

The bondpads 106a and 106b allows the IC chip to send and receive electrical signals to and from, respectively, the external circuitry through providing electrical contacts. Typically, the bondpads 106a and 106b are not aligned with electrical contacts of the external circuitry. The electrical contacts of the bondpads 106a and 106b are therefore relocated by a redistribution process for alignment with the electrical contacts of the external circuitry to provide electrical coupling between the bondpads 106a and 106b and the external circuitry.

To reduce electromagnetic interference during electrical communication between an IC chip and the external circuitry, electrical signals are typically transmitted between the IC chip and the external circuitry in a ground-signal-ground signal path configuration, according to the redistribution process.

With reference to FIG. 1A, each of the bondpads 106a and 106b may be redistributed for carrying electrical signals or connections to ground through various signal paths.

Figure 1B:
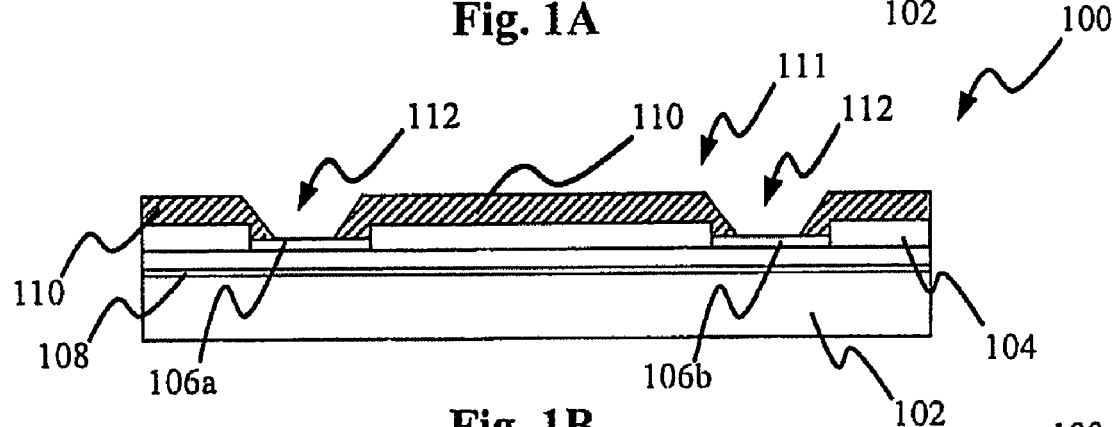

With reference to FIG. 1B, a first separation layer 110 comprising a separation material, such as dielectric Benzocyclobutene (BCB) passivation, is formed on the surface of the IC chip by a BCB passivation process. The first separation layer 110 may comprise multiple layers of either similar or different dielectric materials. One exemplary dielectric material used in the BCB passivation process is BCB 2442. Another suitable separation material is polyimide or other dielectric materials, as known to those skilled in the art.

The BCB passivation process typically starts with the application of an adhesion promoter onto the surface of the IC chip for allowing adequate adhesion between the first separation layer 110 and the surface of the IC chip. The first separation layer 110 is then coated and baked for about 90 seconds at approximately 80 degree Celsius before being aligned and exposed for about 9 seconds to lithograph a separation layer pattern 111 on the first separation layer 110. This is followed by further baking the first separation layer 110 for about 90 seconds at approximately 80 degree Celsius. The first separation layer 110 is then developed with, for example, developer DS2100 for exposing a portion of the bondpads 106a and 106b through openings 112 provided in the separation layer pattern 111. The openings 112 are preferably approximately 70 μm. The final part of the BCB passivation process is to typically include a curing and a descum step. Alternatively, more than one first separation layer is formable on the surface of the IC chip by the BCB passivation process as described.

Preferably, the thickness of the at least one first separation layer 110 is between 2 to 50 µm.

For purposes of brevity and of clarity, only the relocation of the electrical contact of the bondpad 106a is described hereinafter. The relocation of the electrical contact, however, applies to the bondpad 106b and the like bondpads on the IC chip.

Figure 1C:
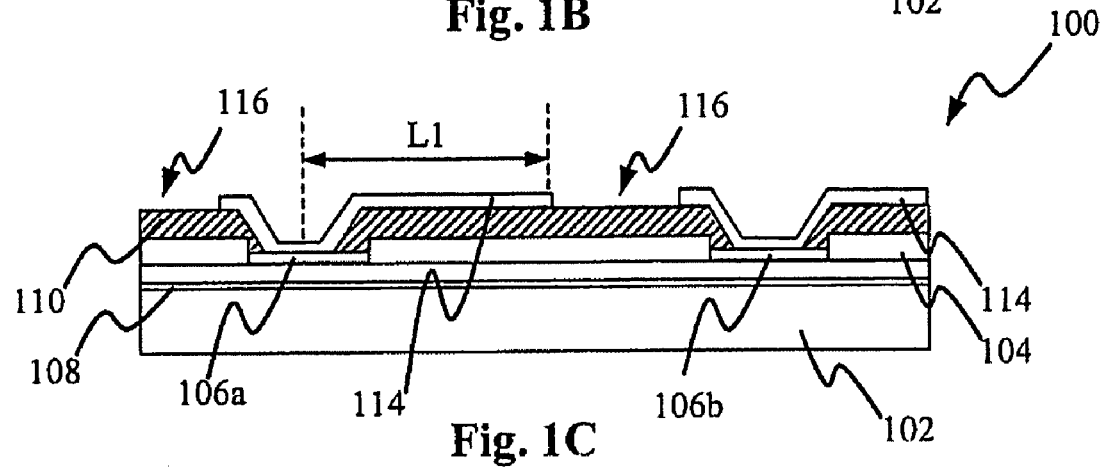

With reference to FIG. 1C, a conductive layer 114, such as a redistribution layer (RDL), is formed on the first separation layer 110 by a RDL process. The first conductive layer 114 is electrically coupled to the bondpad 106a and a substantial portion thereof extends substantially laterally away from the bondpad 106a in a predetermined direction for a first predetermined length L1. A portion of the first conductive layer 114 that is disposed over the bondpad 106a has a diameter of approximately 100 µm. The first conductive layer 114 may comprise multiple layers of either similar or different conductive materials. The amount of extension of the at least one first conductive layer 114 along the chip ground plane 108 in conjunction with its proximity to the chip ground plane 108 are proportional to the reduction of undesirable inductance of the wafer level package 100.

Preferably, the thickness of the first conductive layer 114 is approximately 1 to 2 µm.

The RDL, process typically starts with depositing a layer of conductive material such as a metal alloy (Ti/NiV/Au) or other conductive materials, as known to those skilled in the art on the first separation layer 110. The first conductive layer 114 is deposited by plasma vapour deposition (PVD) on the first separation layer 110. Thereafter, a primer and a photoresist, such as AZ P4620, are sequentially coated on the first conductive layer 114. The photoresist is then baked for about 60 seconds at approximately 100 degree Celsius. The photoresist is then patterned with exposure light for about 8 seconds, before being developed with, for example, developer MF-319. The final part of the RDL process is to chemically etch the photoresist patterned conductive layer for removing portions 116 of the second conductive layer 114 before removing the photoresist by ashing or stripping. Alternatively, more than one first conductive layer 114 is formable on the first separation 110 by the RDL process as described.

Figure 1D:
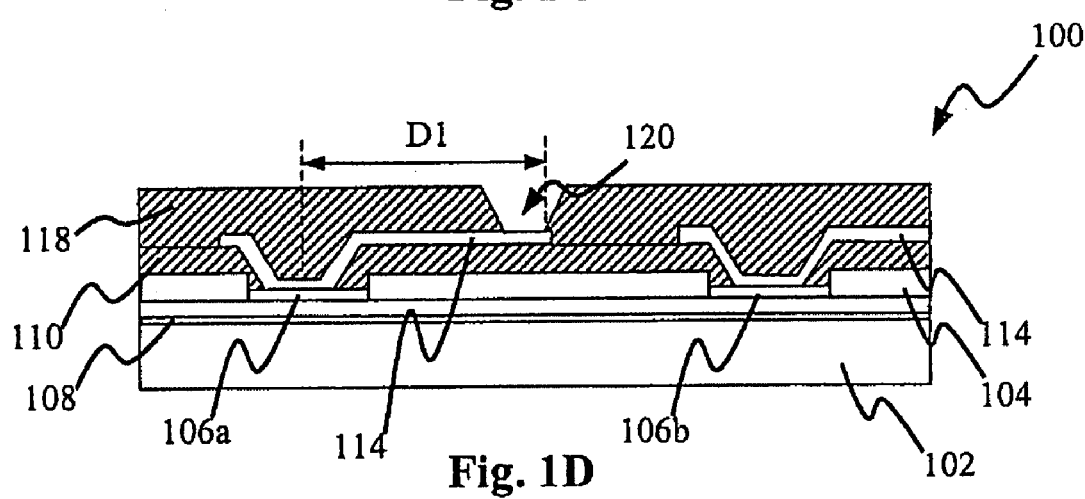

With reference to FIG. 1D, a second separation layer 118 is formed on the first conductive layer 114. The second separation layer 118 may comprise multiple layers of either similar or different dielectric materials and is fabricated using a similar BCB passivation process that is used to form the first separation layer 110. The BCB passivation process used to form the at least one second separation layer includes creating an opening of approximately 80 µm in diameter for exposing an exposed portion 120 of the first conductive layer 114. A substantial portion of the at least one first conductive layer 114 extends substantially laterally away from the bondpad 106a at a first predetermined distance D1. The extension is substantially in the same predetermined direction as the at least one first conductive layer 114. More than one second separation layer 118 may be alternatively formed on the first conductively layer 114 by the BCB passivation process as described earlier.

The first predetermined distance D1 is dependent on the layout of the signal path while the thickness of the second separation layer 118 is preferably between 2 to 50 µm.

Preferably, the first predetermined distance D1 is approximately equal to the first predetermined length L1.

Figure 1E:
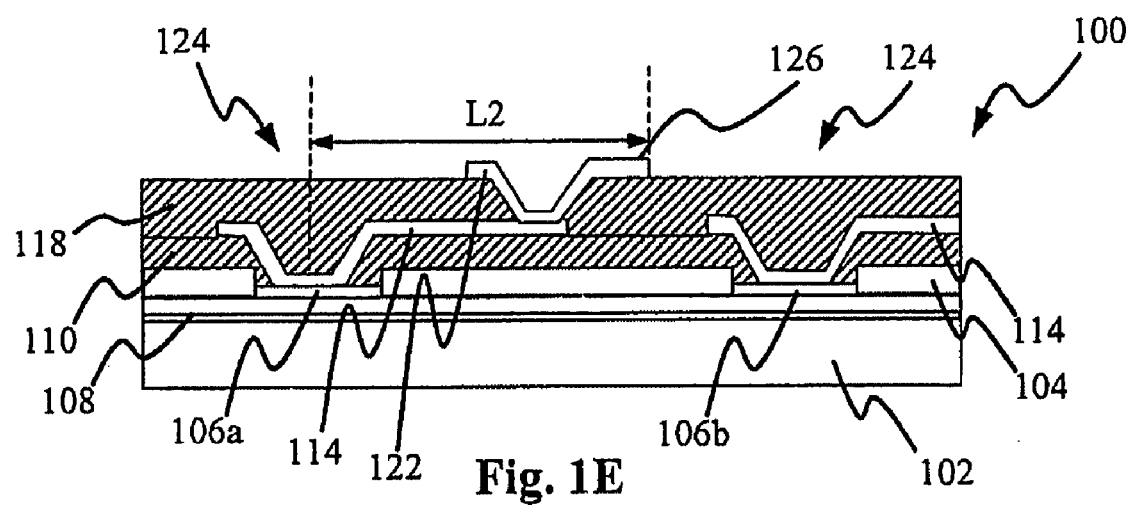

With reference to FIG. 1E, a second conductive layer 122 is formed on the second separation layer 118. The second conductive layer 122 may comprise multiple layers of either similar or different conductive materials. The second conductive layer 122 is fabricated using a similar RDL process used for forming the first conductive layer 114 and includes removing portions 124 of the second conductive layer 122. The RDL process includes coupling the second conductive layer 122 electrically to the exposed portion 120 of the first conductive layer 114. A portion of the second conductive layer 122 that is disposed over the second conductive layer 122 has a diameter of approximately 100 µm. The distance from the bondpad 106a to the extremity of the second conductive layer 122 distal to the bondpad 106a defines a second predetermined length L2. More than one second conductive layer 122 may be alternatively formed on the second separation layer 118 by the RDL process as described earlier.

The first conductive layer 114 and the second conductive layer 122 are electrically coupled at the exposed portion 120 of the at least one first conductive layer 114. The point of coupling occurs substantially near the extremity of the substantial portion of the first conductive layer 114 distal to the bondpad 106a.

An end portion 126 of the second conductive layer 122 extends laterally away from the exposed portion 120 of the first conductive layer 114 of FIG. 1D. The extension is substantially in the same predetermined direction as the first conductive layer 114 for a minimum allowable length for the subsequent placement of a solder.

Preferably, the thickness of the second conductive layer 122 is approximately 1 to 2 µm.

Figure 1F:
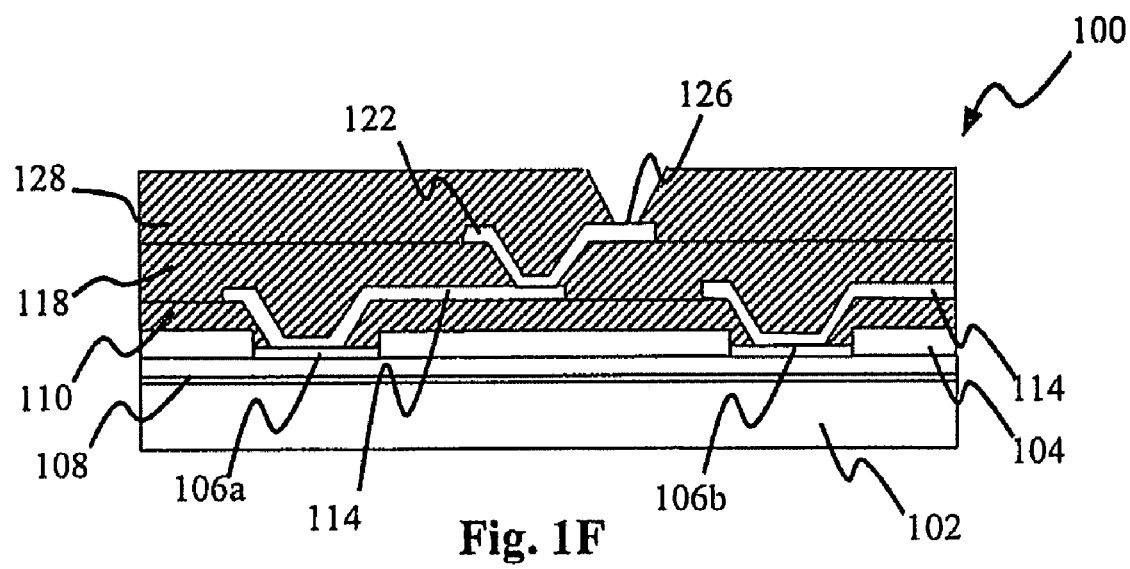

With reference to FIG. 1F, a third separation layer 128 is formed on the second conductive layer 122. The third separation layer 128 may comprise multiple layers of either similar or different dielectric materials and is fabricated using a similar BCB passivation process that is used to form the first and second separation layers 110, 118. The BCB passivation process used for forming the third separation layer 128 creates an opening of approximately 225 µm in diameter for exposing the end portion 126 of the second conductive layer 122. The end portion 126 is substantially at the extremity of the second conductive layer 122 distal to the point of coupling between the exposed portion 120 of the first conductive layer 114 and the second conductive layer 122. More than one third separation layer 128 may be alternatively formable on the second conductive layer 122 by the BCB passivation process as described earlier.

The thickness of the at least one third separation layer 128 is preferably between 2 to 50 µm.

Figure 1G:
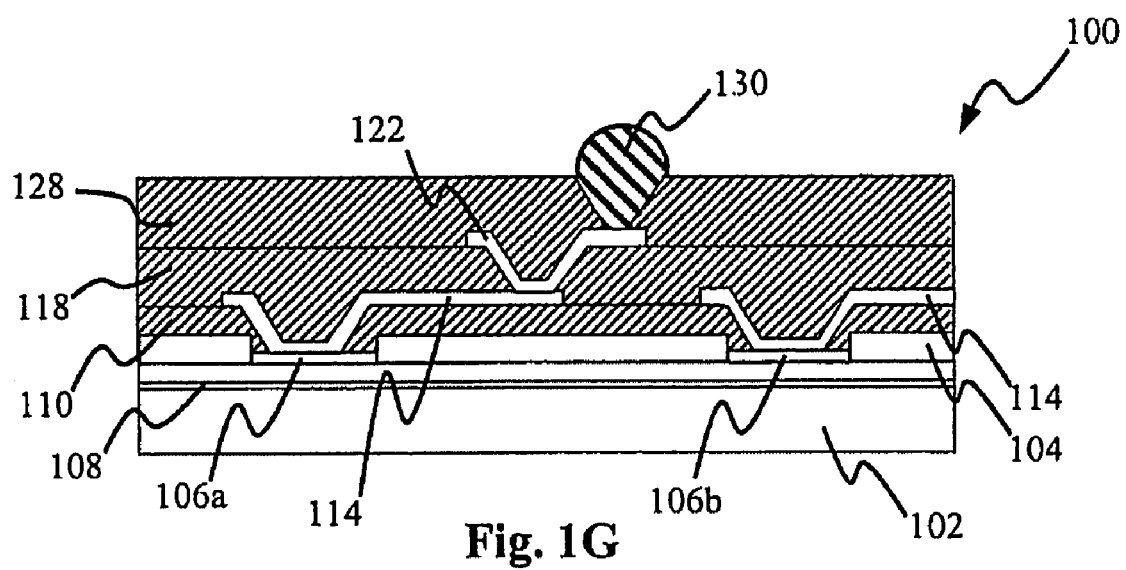

With reference to FIG. 1G, solder 130 is typically attached to the end portion 126 of the second conductive layer 122, after which the solder 130 is reflowed and the wafer level package 100 is formed. The reflowing process enables the solder 130 to electrically couple to the end portion 126 of the second conductive layer 122 and thereby become electrically communicable with the bondpad 106a.

Solder ball having ball pitch of 0.5 mm is typically used as the solder 130.

A under bump metallisation (UBM) process is preferably used to form a barrier layer of metallic material (not shown) between the solder 130 and the second conductive layer 122 to prevent intermetallic diffusion between the second conductive layer 122 and the solder 130.

After fabrication, the wafer level package 100 having a typical package size of 5×5 mm is electrically tested before being separated from other wafer level packages to form individual packages through a singulation process.

The purpose of having the point of coupling between the first conductive layer 114 and the second conductive layer 122 occur substantially near to the extremity of the substantial portion of the first conductive layer 114 distal to the bondpad 106a is to reduce any parasitic capacitance from developing in between the solder 130 and the chip ground plane 108.

The solder 130 is also disposed away from the chip ground plane 108 through the use of the three-separation-layer structure. This reduces the impact of parasitic capacitance on the operating performances of the wafer level package 100 during high frequency operations.

The conductive layers 114, 122 are further kept at an optimum distance from the chip ground plane 108 so that the majority of the conductive layers 114, 122 are in proximity to the chip ground plane 108. The advantage of having such an arrangement is the reduction of parasitic inductance associated with the conductive layers 114, 122 during operation of the wafer level package 100.

Figure 2:
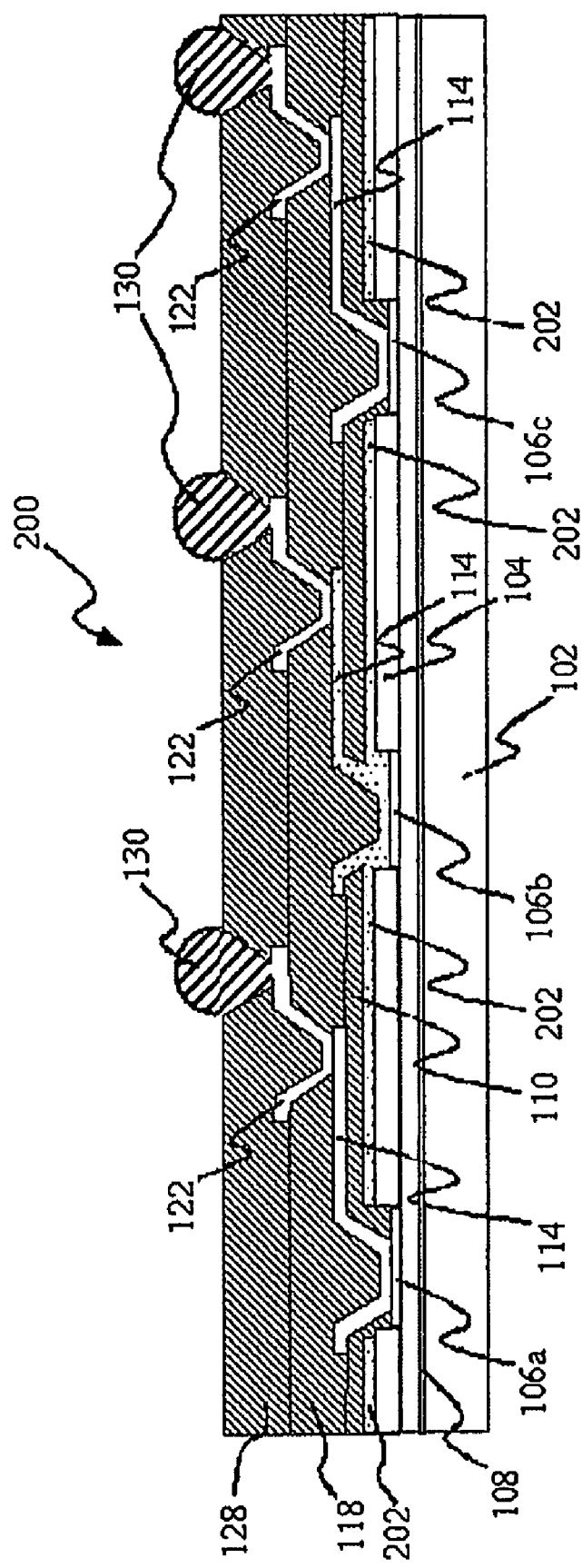
FIG. 2 is a cross-sectional view of the wafer level package according to a second embodiment of the invention.

FIG. 2 shows a wafer level package 200 according to a second embodiment of the invention for further reducing the parasitic inductance associated with the first conductive layer 114 during high frequency operation. The first conductive layer 114 of the wafer level package 200 has a package ground plane 202 that is electrically coupled to the first conductive layer 114. The package ground plane 202 extends laterally away from the bondpad 106b and on the protective film 104. This is achieved by forming the package ground plane 202 of the first conductive layer 114 on the surface of the IC chip prior to the formation of the first separation layer 110.

One side of the ground plane 202 extends from the bondpad 106b and underneath the substantial potion of the first conductive layer 114 in the predetermined direction for a length preferably greater than the second predetermined length L2. Another side of the package ground plane 202 similarly extends from the bondpad 106b and underneath the substantial potion of an adjacent first conductive layer 114 in a direction substantially opposing the predetermined direction. The length of extension of the other side of the ground plane 202 is also preferably greater than the second predetermined length L2. This arrangement allows the at least one first conductive layer 114 to be closer to a ground potential during operating, thereby reducing the parasitic capacitance and inductance therein and improves on the high frequency performance of the wafer level package 200.

The wafer level package 200 is preferably arranged in the ground-signal-ground (GSG) signal path configuration to be used for reducing electromagnetic interference therein during operation thereof. In the GSG configuration, bondpad 106b is preferably connected to an external ground reference while bondpads 106a and 106c are used for signal transmission.

With the suppression of both the parasitic capacitance and inductance, the signal loss of the embodiments of the invention is kept at a minimum. This enhances the frequency response performance thereof. In addition, due to use of conventional processes and materials, the embodiments of the invention is easily incorporable either at a front-end fabrication foundry or in a back-end assembly house and is highly adaptable for conventional high-volume batch production.

The wafer level package 100 having the GSG signal path configuration and designed using optimised and unoptimised layout is tested by simulation. The simulation obtains the frequency response of the wafer level package 100. The purpose of conducting the simulation using the two layouts is to determine the frequency response performance of the wafer level package 100 at boundary conditions.

Figure 3:
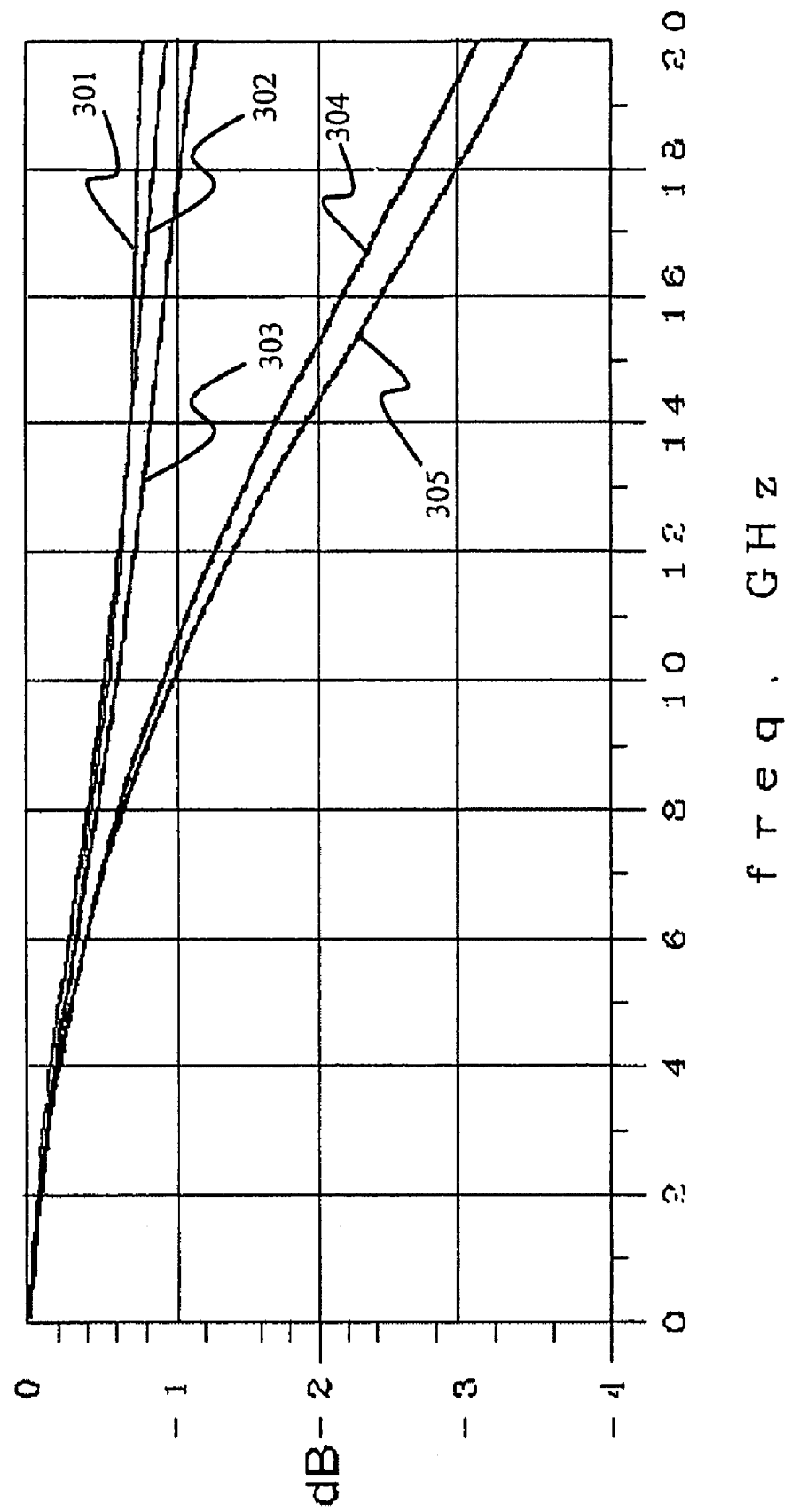
FIG. 3 is a graph illustrating frequency response characteristic using optimised and unoptimised layouts of the present invention of FIG. 1G and the frequency response characteristic of three other prior arts.

The simulation covers frequency responses up to a frequency of 20 GHz. The simulation is conducted in conjunction with wafer level packages fabricated according to disclosures provided in the prior art of Lu, Elenius et al. and Fujitsu. Test results from the simulation are shown in the graph of FIG. 3, wherein curves 301 and 302 represent test results from the wafer level package 100 using the optimised and unoptimised layouts respectively. The graph shows that the wafer level package 100 is capable of achieving less than 1 dB of signal loss up to the frequency of 20 GHz regardless of variation in layout designs.

Test results of the prior art wafer level packages of Lu et al., Elenius et al. and Fujitsu are represented by curves 303, 304 and 305 respectively. The test results of the three prior arts indicate a shortfall in attaining less than 1 dB of signal loss up to the frequency of 20 GHz, thus making them unsuitable for high frequency operation that is required in most modern RF and microwave applications.

Although only a number of embodiments of the invention are disclosed, it becomes apparent to one skilled in the art in view of this disclosure that numerous changes or modification can be made without departing from the scope and spirit of the invention. For example, although chemical etch is used in the RDL process in the forgoing embodiment, the RDL process may be efficiently used if the chemical etch is substituted by plasma etch or the like.

The invention claimed is:

1. A method for fabricating wafer level package having a plurality of separation and conductive layers formed on a surface of an integrated circuit chip, the method comprising the steps of:

forming at least one first separation layer on the surface of the integrated circuit chip having a bondpad thereon, wherein a portion of the bondpad is exposed;

forming at least one first conductive layer on the at least one first separation layer, wherein the at least one first conductive layer is electrically coupled to the bondpad and extends substantially laterally away therefrom in a predetermined direction for a first predetermined length;

forming at least one second separation layer on the at least one first conductive layer wherein a portion of the at least one first conductive layer extending substantially laterally away from the bondpad in the predetermined direction for a first predetermined distance is exposed;

forming at least one second conductive layer on the at least one second separation layer wherein the at least one second conductive layer is electrically coupled to the exposed portion of the at least one first conductive layer and extends substantially laterally away from the bondpad in the predetermined direction; and forming at least one third separation layer on the at least one second conductive layer wherein a portion of the at least one second conductive layer extending substantially laterally away from the bondpad in the predetermined direction is exposed wherein solder is electrically couplable to the exposed portion of the at least one second conductive layer whereby the solder is electrically communicable with the bondpad and the exposed portion of the at least one first conductive layer is substantially adjacent to the extremity of the at least one first conductive layer distal to the bondpad, and a chip ground plane is laid in the integrated circuit chip for providing a ground to the at least one first conductive layer and the solder.

2. The method of claim 1, prior to the step of forming the at least one first separation layer, further comprising the step of forming a package ground plane for providing the ground to the at least one first conductive layer, wherein the package ground plane is formed on the surface of the integrated circuit chip.

3. The method of claim 1, wherein the step of forming the at least one first separation layer on the surface of the integrated circuit chip having the bondpad thereon comprises
depositing at least one first separation material for forming the at least one first separation layer;
baking the at least one first separation material;
exposing the at least one first separation material;
curing the at least one first separation material; and
removing at least one portion of the at least one first separation material over the portion of the bondpad.

4. The method of claim 1, wherein the step of forming the at least one first conductive layer on the at least one first separation layer comprises
depositing at least one first conductive material;
coating a layer of photoresist on the at least one first conductive material;
baking the photoresist;
exposing the photoresist; and
removing at least one portion of the at least one first conductive material.

5. The method of claim 1, wherein the step of forming the at least one second separation layer on the at least one first conductive layer comprises
depositing at least one second separation material;
baking the at least one second separation material;
exposing the at least one second separation material;
curing the at least one second separation material; and
depositing the at least one second separation layer and removing at least one portion of the at least one second separation material for forming the at least one second separation layer.

6. The method of claim 1, wherein the step of forming the at least one second conductive layer on the at least one second separation layer comprises
depositing at least one second conductive material;
coating a layer of photoresist on the at least one second conductive material;
baking the photoresist;
exposing the photoresist; and
depositing the at least one second conductive layer and removing at least one portion of the at least one second conductive material for forming the at least one second conductive layer.

7. The method of claim 1, wherein the step of forming the at least one third separation layer on the second conductive layer comprises
depositing at least one third separation material;
baking the at least one third separation material;
exposing the at least one third separation material
curing the at least one second separation material; and
removing at least one portion of the at least one third separation material for forming the at least one third separation layer.

8. The method of claim 1, wherein the at least one first conductive layer has at least two portions extending substantially laterally away from the bondpad respectively in directions in and opposite the predetermined direction, each of the at least two portions extending laterally away from the bondpad for a length greater than a second predetermined length.

9. The method of claim 1, wherein the second predetermined length is the distance from the bondpad to the extremity of the at least one second conductive layer distal to the bondpad.

10. The method of claim 1, wherein a barrier layer of metallic material is formed in between the solder and the at least one second conductive layer for preventing intermetallic diffusion between the solder and the at least one second conductive layer.

11. The method of claim 1, wherein the first separation layer, the second separation layer and the third separation layer are fabricated with substantially similar materials.

12. The method of claim 1, wherein the first conductive layer and the second conductive layer are fabricated with substantially similar materials.

13. A wafer level package having a plurality of separation and conductive layers formed on a surface of an integrated circuit chip, the wafer level package comprising:
at least one first separation layer formed on the surface of the integrated circuit chip having a bondpad thereon, wherein a portion of the bondpad is exposed,
at least one first conductive layer is formed on the at least one first separation layer wherein the at least one first conductive layer is electrically coupled to the bondpad and extends substantially laterally away therefrom in a predetermined direction for a first predetermined length;
at least one second separation layer formed on the at least one first conductive layer wherein a portion of the at least one first conductive layer extending substantially laterally away from the bondpad in the predetermined direction for a first predetermined distance is exposed;
at least one second conductive layer formed on the at least one second separation layer wherein the second conductive layer is electrically coupled to the exposed portion of the first conductive layer and extends substantially laterally away from the bondpad in the predetermined direction; and
at least one third separation layer formed on the at least one second conductive layer wherein a portion of the at least one second conductive layer extending substantially laterally away from the bondpad in the predetermined direction is exposed
wherein solder is electrically couplable to the exposed portion of the at least one second conductive layer whereby the solder is electrically communicable to the bondpad and the exposed portion of the at least one first conductive layer is substantially adjacent to the extremity of the at least one first conductive layer distal to the bondpad, and a chip ground plane is laid in the integrated circuit chip for providing a ground to the at least one first conductive layer and the solder.

14. The wafer level package of claim 13, wherein a package ground plane formed between the surface of the integrated circuit chip and the at least one first separation layer.

15. The wafer level package of claim 13, wherein an opening of the at least one first separation layer for exposing a portion of the bondpad is preferably approximately 70 micrometers in diameter.

16. The wafer level package of claim 13, wherein a portion of the at least one first conductive layer disposed over the bondpad is preferably approximately 100 micrometers in diameter.

17. The wafer level package of claim 13, wherein an opening of the at least one second separation layer for exposing an exposed portion of the at least one first conductive layer is preferably approximately 80 micrometers in diameter.

18. The wafer level package of claim 13, wherein a portion of the at least one second conductive layer disposed over the exposed portion of the at least one first conductive layer is preferably approximately 100 micrometers in diameter.

19. The wafer level package of claim 13, wherein an opening of the at least one third separation layer for exposing an end portion of the second conductive layer is preferably approximately 225 micrometers in diameter.

20. The wafer level package of claim 13, wherein a package ground chip plane is electrically coupled to the at least one first conductive layer and the bondpad.

21. The wafer level package of claim 13, wherein the thickness of each of the first, second and third separation layer is preferably between 2 to 50 micrometers.

22. The wafer level package of claim 13, wherein the thickness of each of the first and second conductive layer is preferably approximately 1 to 2 micrometers.

23. The wafer level package of claim 13, wherein the integrated circuit chip comprises at least one of silicon, silicon germanium, gallium arsenide, gallium nitride and indium phosphide.

24. The wafer level package of claim 13, wherein the integrated circuit chip is fabricated on a semiconductor wafer having a diameter between 50 to 300 millimeters.

25. The wafer level package of claim 13, wherein the separation and conductive layers are formed by common fabrication processes.

* * * * *